United States Patent
Pohjonen et al.

(10) Patent No.: US 10,794,739 B2
(45) Date of Patent: Oct. 6, 2020

(54) APPARATUS AND METHOD OF FORMING A SENSOR ARRAY USING THE APPARATUS

(71) Applicant: Nokia Technologies Oy, Espoo (FI)

(72) Inventors: Helena Pohjonen, Espoo (FI); Sami Kallioinen, Espoo (FI); Pekka Korpinen, Espoo (FI)

(73) Assignee: Nokia Technologies Oy, Espoo (FI)

( * ) Notice: Subject to any disclaimer, the term of this patent is extended or adjusted under 35 U.S.C. 154(b) by 209 days.

(21) Appl. No.: 15/770,630

(22) PCT Filed: Oct. 21, 2016

(86) PCT No.: PCT/FI2016/050740
§ 371 (c)(1),
(2) Date: Apr. 24, 2018

(87) PCT Pub. No.: WO2017/072407
PCT Pub. Date: May 4, 2017

(65) Prior Publication Data
US 2019/0063966 A1 Feb. 28, 2019

(30) Foreign Application Priority Data

Oct. 28, 2015 (EP) .................................. 15191786

(51) Int. Cl.
*G01D 18/00* (2006.01)
*H04N 17/00* (2006.01)
*H04N 5/374* (2011.01)
*H04N 5/369* (2011.01)
*H01L 27/146* (2006.01)

(52) U.S. Cl.
CPC ....... *G01D 18/008* (2013.01); *H01L 27/1469* (2013.01); *H01L 27/14607* (2013.01); *H01L 27/14634* (2013.01); *H01L 27/14647* (2013.01); *H04N 5/3696* (2013.01); *H04N 5/374* (2013.01); *H04N 17/002* (2013.01)

(58) Field of Classification Search
CPC .................. G01D 18/008; G01D 3/022; H01L 29/14607; H01L 29/14634; H01L 27/14647; H01L 27/1469; H04N 5/3696; H04N 5/374

See application file for complete search history.

(56) References Cited

U.S. PATENT DOCUMENTS 5,347,476 A * 9/1994 McBean, Sr. .......... G01D 3/022
   702/91
6,676,600 B1 * 1/2004 Conero .................... A61B 5/00
   600/438

(Continued)

FOREIGN PATENT DOCUMENTS

| DE | 10 2009 030 085 A1 | 3/2010 |
| WO | WO 2012/138345 A1 | 10/2012 |
| WO | WO-2015/032837 A1 | 3/2015 |

*Primary Examiner* — Helen C Kwok
(74) *Attorney, Agent, or Firm* — Harrington & Smith

(57) ABSTRACT

An apparatus and method, the apparatus including a plurality of sensors; readout circuitry configured to read information from each of the plurality of sensors; and wherein the apparatus has identifier information and calibration information stored with the identifier information and the apparatus is configured to be coupled to at least one other apparatus to form an array of apparatus.

19 Claims, 6 Drawing Sheets

(56) References Cited

U.S. PATENT DOCUMENTS

Figure 1:
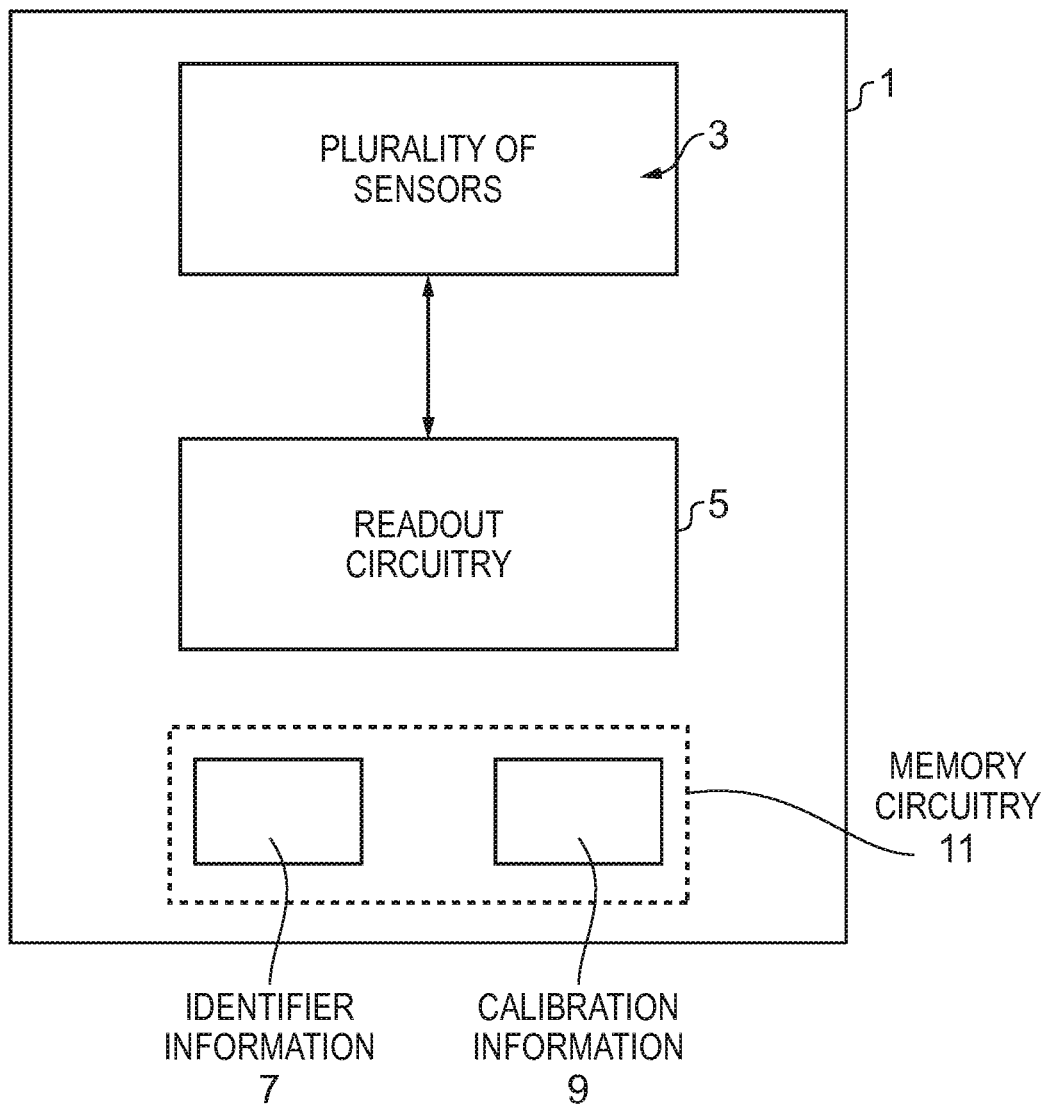

| | | | | |
|---|---|---|---|---|
| 7,630,848 B2* | 12/2009 | Loosme | ............ | G01N 35/00871 |
| | | | | 702/85 |
| 7,933,731 B2* | 4/2011 | Hollander | .............. | G01D 3/022 |
| | | | | 702/104 |
| 7,981,678 B2* | 7/2011 | Reynolds | ......... | G01N 33/48771 |
| | | | | 422/82.01 |
| 8,024,146 B2* | 9/2011 | Bey | ....................... | G01F 15/022 |
| | | | | 702/100 |
| 8,554,505 B2* | 10/2013 | Vayhinger | .......... | G01N 27/4165 |
| | | | | 702/100 |
| 2002/0074499 A1 | 6/2002 | Butler | ........................ | 250/338.1 |
| 2009/0152664 A1 | 6/2009 | Klem et al. | .................... | 257/440 |
| 2010/0271489 A1 | 10/2010 | Muukki | ..................... | 348/187 |
| 2011/0048101 A1* | 3/2011 | Heide | ................... | A61M 1/367 |
| | | | | 73/1.57 |
| 2011/0179851 A1* | 7/2011 | Mack | .................... | A42B 3/046 |
| | | | | 73/1.79 |
| 2012/0291515 A1* | 11/2012 | Stangelmayer | ...... | G01N 21/274 |
| | | | | 73/1.01 |
| 2016/0010453 A1* | 1/2016 | Breviere | ................ | G01N 30/88 |
| | | | | 175/40 |

\* cited by examiner

APPARATUS AND METHOD OF FORMING A SENSOR ARRAY USING THE APPARATUS

TECHNOLOGICAL FIELD

Examples of the disclosure relate to an apparatus and method of forming a sensor array using the apparatus. In particular, they relate to an apparatus and method of forming a sensor array using the apparatus where each apparatus in the sensor array can be individually calibrated and addressed.

BACKGROUND

An apparatus for sensing may be configured to detect a parameter and produce an electrical output indicative of the detected parameter. The parameter could be, for example, electromagnetic radiation, temperature, chemicals, humidity, strain, pressure or any other suitable parameter. Such apparatus requires readout circuitry configured to read information from the apparatus.

It is desirable to produce better sensing apparatus.

BRIEF SUMMARY

According to various, but not necessarily all, examples of the disclosure there may be provided an apparatus comprising: a plurality of sensors; readout circuitry configured to read information from each of the plurality of sensors; and wherein the apparatus has identifier information and calibration information stored with the identifier information and the apparatus is configured to be coupled to at least one other apparatus to form an array of apparatus.

In some examples the identifier information may enable the apparatus to be uniquely identified within an array of sensors.

In some examples the identifier information may enable the location of the apparatus within an array of sensors to be determined.

In some examples the apparatus may comprise circuitry configured to use the identifier information to retrieve the calibration information and use the calibration information to process information obtained from the readout circuitry of the apparatus identified by the identifier information.

In some examples the plurality of sensors may be provided on a front side of a substrate.

In some examples the plurality of sensors may be provided overlaying at least part of the read out circuitry.

In some examples at least part of the read out circuitry may be provided on a rear side of a substrate.

In some examples the plurality of sensors may comprise at least one of; electromagnetic radiation sensors, temperature sensors, chemical sensors, humidity sensors, strain sensors, pressure sensors.

According to various, but not necessarily all, examples of the disclosure there may be provided a sensor array comprising a plurality of apparatus as described above.

In some examples the readout circuitry may be configured to enable information to be read from a plurality of apparatus simultaneously.

In some examples the sensor array may comprise at least a first apparatus having a first size and at least a second apparatus having a second size where the first size is different to the second size.

In some examples the sensor array may comprise at least a first apparatus having a first shape and at least a second apparatus having a second shape where the first shape is different to the second shape.

In some examples the sensor array may comprise at least a first apparatus comprising a first number of sensors and at least a second apparatus having a second number of sensors where the first number of sensors is different to the second number of sensors.

In some examples the sensor array may comprise an active apparatus configured to detect a trigger event and control circuitry configured to activate a plurality of apparatus within the sensor array in response to the detected trigger event.

In some examples the sensor array may be provided on a flexible substrate.

In some examples the sensor array may be provided on a curved substrate.

According to various, but not necessarily all, examples of the disclosure there may be provided a method comprising: providing an apparatus comprising a plurality of sensors wherein the apparatus comprises read out circuitry configured to read information from each of the plurality of sensors and has identifier information assigned to the apparatus; calibrating the apparatus to obtain calibration information; storing the calibration information with the identifier information; and coupling the apparatus to at least one other apparatus to form an array of sensors.

In some examples the identifier information may enable the apparatus to be uniquely identified within an array of sensors.

In some examples the identifier information enables the location of the apparatus within an array of sensors to be determined.

In some examples the method comprises using the identifier information to retrieve the calibration information and using the calibration information to process information obtained from the readout circuitry of the apparatus.

In some examples the plurality of sensors may be provided on a front side of a substrate.

In some examples the plurality of sensors may be provided overlaying at least part of the readout circuitry.

In some examples at least part of the readout circuitry may be provided on a rear side of a substrate.

In some examples the plurality of sensors may comprise at least one of; electromagnetic radiation sensors, temperature sensors, chemical sensors, humidity sensors, strain sensors, pressure sensors.

In some examples the method may comprise reading information from the sensors of a plurality of apparatus simultaneously.

In some examples the sensor array may comprise at least a first apparatus having a first size and at least a second apparatus having a second size where the first size is different to the second size.

In some examples the sensor array may comprise at least a first apparatus having a first shape and at least a second apparatus having a second shape where the first shape is different to the second shape.

In some examples the sensor array may comprise at least a first apparatus comprising a first number of sensors and at least a second apparatus having a second number of sensors where the first number of sensors is different to the second number of sensors.

In some examples the method may comprise providing an active apparatus within the sensor array where the active apparatus is configured to detect a trigger event and providing control circuitry configured to activate a plurality of apparatus within the array in response to the detected trigger event.

In some examples the sensor array may be provided on a flexible substrate.

In some examples the sensor array may be provided on a curved substrate.

In some examples the method may comprise calibrating the sensor array after the apparatus have been coupled together.

According to various, but not necessarily all, examples of the disclosure there may be provided examples as claimed in the appended claims.

BRIEF DESCRIPTION

Figure 2:
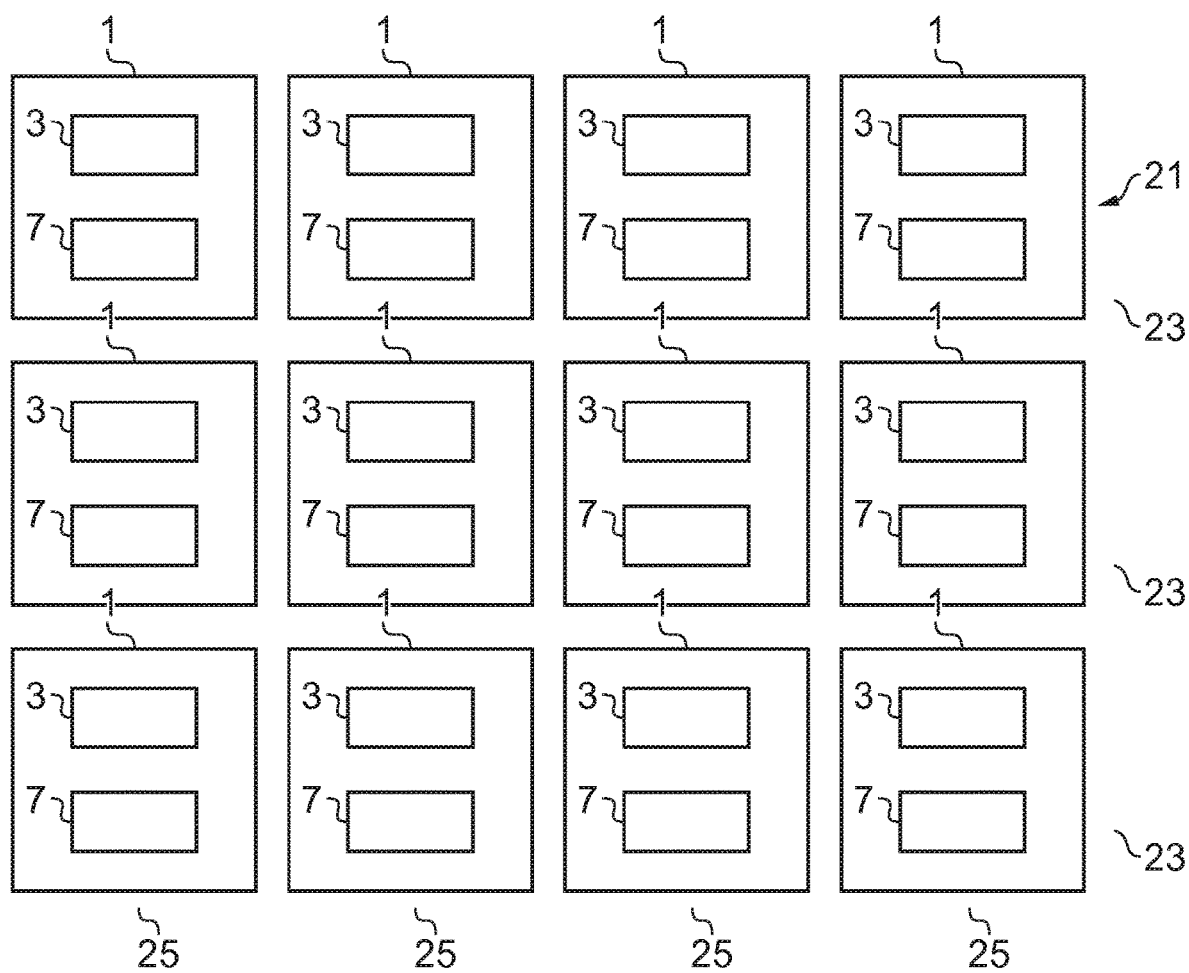
Figure 3:
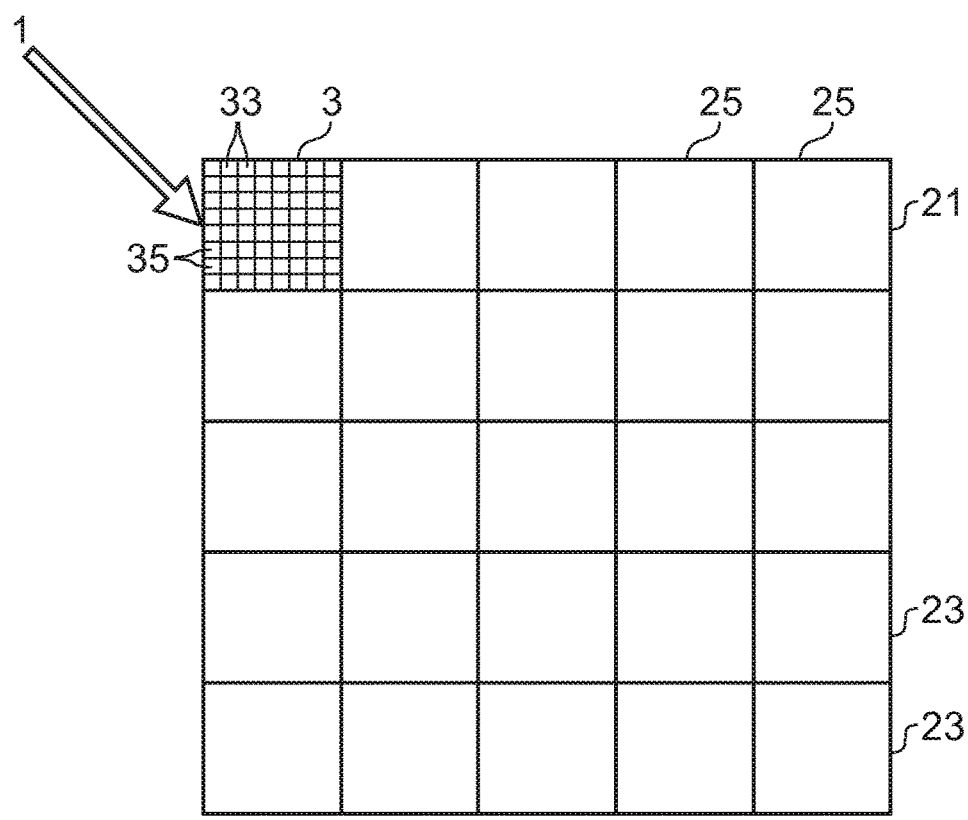
Figure 4:
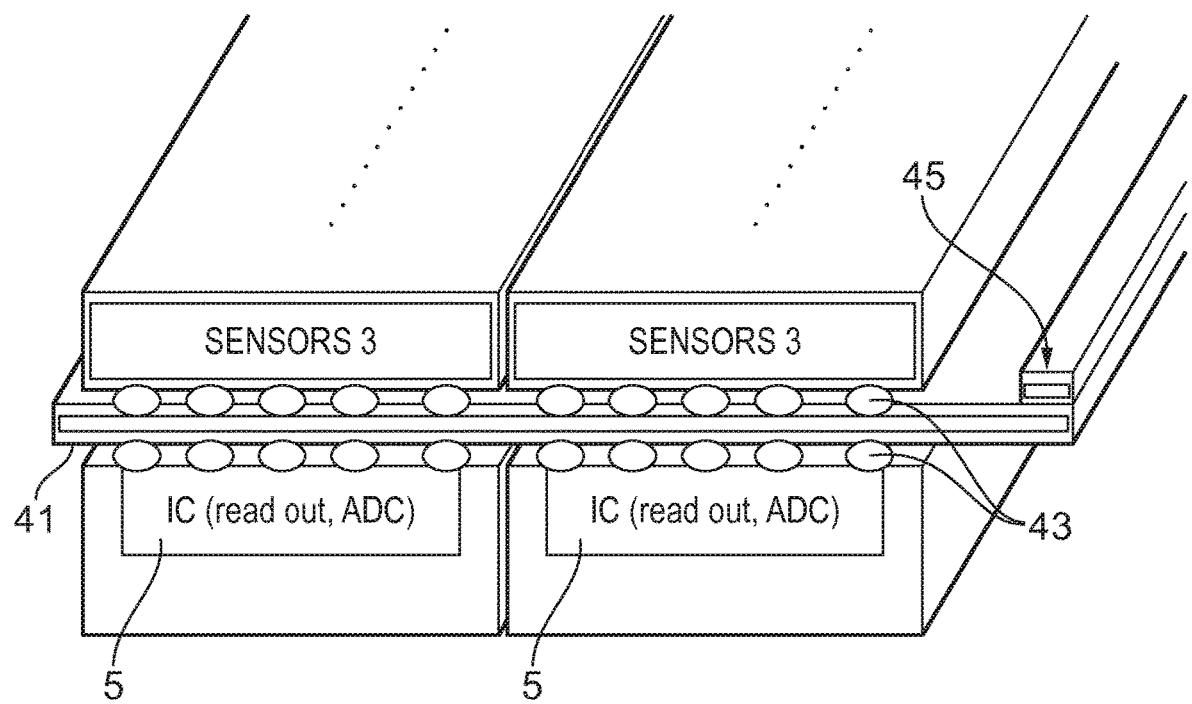
Figure 5A:
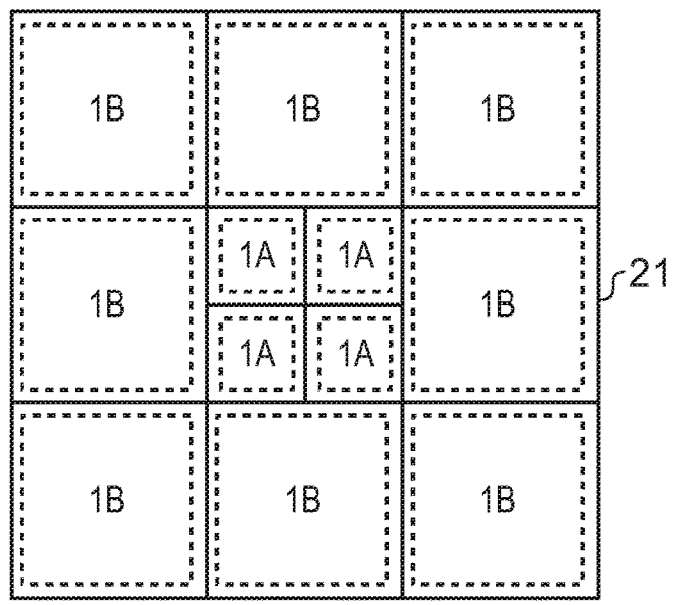
Figure 5B:
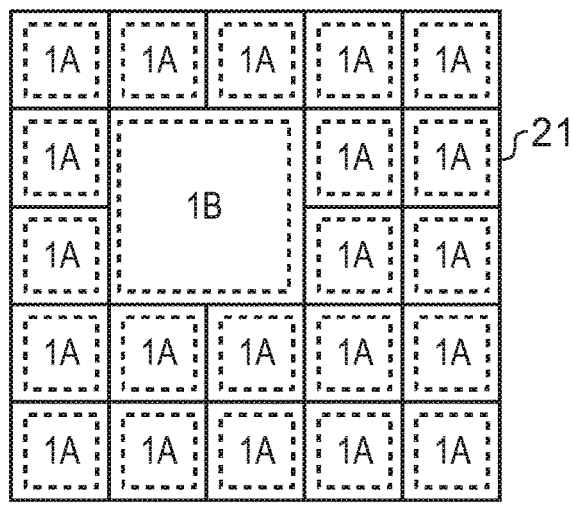
Figure 5C:
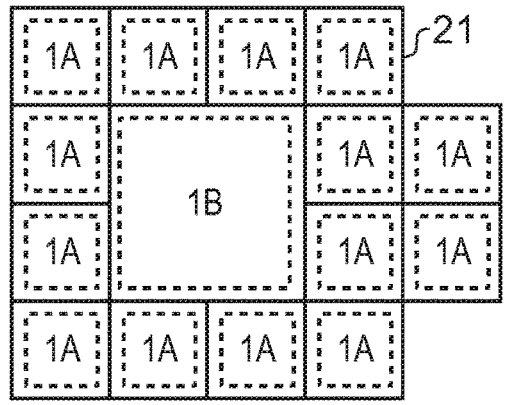
Figure 6:
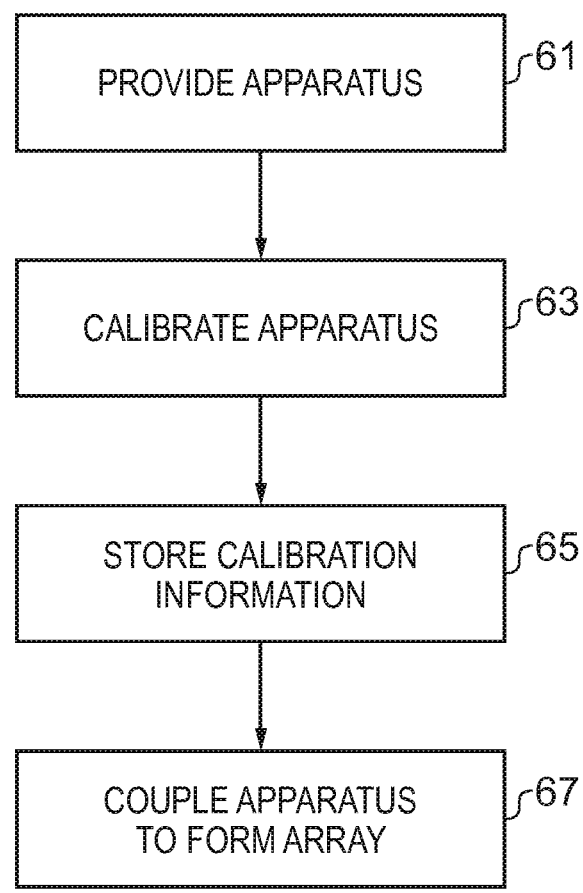
Figure 7:
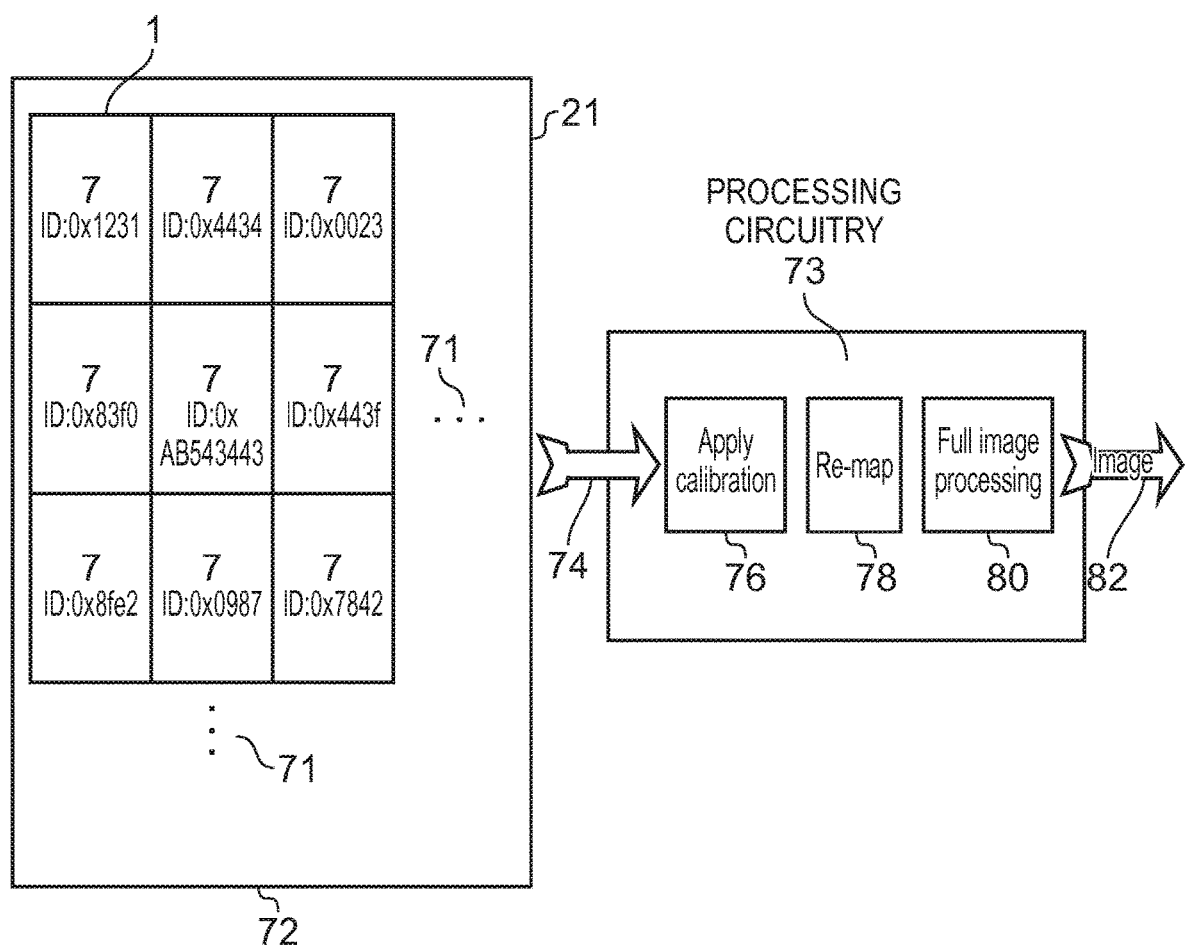

For a better understanding of various examples that are useful for understanding the detailed description, reference will now be made by way of example only to the accompanying drawings in which:

FIG. 1 illustrates an apparatus;
FIG. 2 illustrates a sensor array;
FIG. 3 illustrates another sensor array;
FIG. 4 illustrates a perspective view of a sensor array;
FIGS. 5A to 5C illustrate examples of sensor arrays;
FIG. 6 illustrates a method; and
FIG. 7 illustrates another method.

DETAILED DESCRIPTION

Examples of the disclosure relate to sensor arrays 21 comprising a plurality of individually addressable apparatus 1. Each apparatus 1 within a sensor array 21 may comprise a plurality of sensors 3 and readout circuitry 5 configured to read out information from the plurality of sensors 3. Two or more apparatus 1 may be coupled together to form a sensor array 21. Each of the apparatus 1 within the array 21 may be calibrated individually. The calibration of individual apparatus 1 may be performed before the apparatus 1 have been coupled together. The calibration information may then be used after the sensor array 21 has been formed to calibrate the information obtained by each individual apparatus 1.

FIG. 1 schematically illustrates an apparatus 1 comprising: a plurality of sensors 3; readout circuitry 5 configured to read information from each of the plurality of sensors 3; and wherein the apparatus 1 has identifier information 7 and calibration information 9 stored with the identifier information 7 and the apparatus 1 is configured to be coupled to at least one other apparatus 1 to form an array 21 of sensors.

The example apparatus 1 of FIG. 1 comprises a plurality of sensors 3. The sensors 3 may comprise any means which may be configured to detect a parameter and convert the detected parameter into an electrical response.

In some examples the plurality of sensors 3 may comprise photodetectors. The photodetectors may comprise any means which may be configured to detect light incident on the apparatus 1 and convert the detected light into an electrical response. Other types of sensors 3 may be used in other examples of the disclosure. For example the apparatus 1 may comprise sensors 3 configured to detect electromagnetic radiation, temperature, chemicals, humidity, strain, pressure or any other suitable physical parameter.

In some examples the plurality of sensors 3 within the apparatus 1 may comprise different types of sensor 3. The different types of sensor 3 may be arranged to detect different parameters. In some examples different types of sensor 3 may be arranged to detect the same parameter but may be arranged to have a different sensitivity to the parameter.

The apparatus 1 may comprise any number of sensors. It is to be appreciated that different apparatus 1 may comprise different numbers of sensors 3.

The plurality of sensors 3 may be arranged in any suitable configuration within the apparatus 1. In some examples the sensors 3 may be arranged on a surface of the apparatus 1. The sensors 3 could be arranged on a front surface of the apparatus 1. The sensors 3 may be arranged in a configuration which optimises the exposure of the sensors 3 to the parameter(s) which are to be detected. For instance, where the sensors 3 are arranged to detect incident light or other types of electromagnetic radiation the sensors 3 may be arranged on the surface of the apparatus 1 to optimise the amount of light or other type of electromagnetic radiation which is incident on the sensor 3.

In some examples at least some of the sensors 3 may be provided within the apparatus 1. For instance a strain sensor could be provided within a substrate of the apparatus 1 or could be provided underneath an array of photodetectors.

In some examples at least some of the sensors 3 may be provided overlaying each other. For instance, a first photosensor could be provided overlying a second photosensor. In such examples the first photosensor may be responsive to a first wavelength of light but may be transparent or at least partially transparent to a second wavelength of light. This second photosensor may be responsive to the second wavelength of light. Having the sensors 3 overlaying each other in this manner may enable more information to be obtained for a given surface area of an apparatus 1.

The apparatus 1 also comprises readout circuitry 5. The readout circuitry 5 may comprise any means which may be configured to enable information to be read from the plurality of sensors 3. The readout circuitry 5 may be configured to provide the information from the sensors 3 to processing circuitry. The processing circuitry may be separate to the apparatus 1.

The readout circuitry 5 may be configured to receive an electrical output signal from the sensors 3 where the electrical output signal comprises information indicative of the sensed parameter. The readout circuitry 5 may comprise an analogue to digital converter and any other suitable components.

The readout circuitry 5 may be configured to enable each of the plurality of sensors 3 within the apparatus 1 to be addressed individually. This may enable data obtained by each of the plurality of sensors 3 within the apparatus 1 to be processed and analysed individually.

The readout circuitry 5 may be provided within the apparatus 1 such that the plurality of sensors 3 and the readout circuitry 5 provide an independent apparatus 1. The apparatus 1 may be independent in that it may operate independently of other apparatus 1 and may be addressed individually. The apparatus 1 may then be coupled to other apparatus 1 to form a modular array 21 of sensors.

In the example of FIG. 1 the apparatus 1 also comprises identifier information 7. The identifier information 7 may comprise any information which enables the apparatus 1 to be uniquely identified within an array 21 of sensors. In some examples the identifier information may comprise a series of digits and/or characters which are assigned to the apparatus 1 when the apparatus 1 is fabricated.

The identifier information 7 may be stored in memory circuitry 11. The memory circuitry 11 may comprise any means which may be configured to enable identifier information 7 to be stored in the apparatus 1. The memory circuitry 11 may comprise non-volatile memory circuitry 11.

Although the memory circuitry 11 is illustrated as a single component in FIG. 1 it is to be appreciated that it may be implemented as one or more separate components some or all of which may be integrated/removable and/or may provide permanent/semi-permanent/dynamic/cached storage.

In the example of FIG. 1 calibration information 9 is also stored in the memory circuitry 11. It is to be appreciated that in other examples the calibration information 9 need not be stored within the apparatus 1. In other examples the calibration information 9 may be stored externally to the apparatus 1. The calibration information 9 may be stored with identifier information 7 such that the identifier information 7 may be used to retrieve the calibration information 9.

The calibration information 9 may comprise information that is obtained when the apparatus 1 is manufactured. The calibration information 9 may comprise information obtained from calibration measurements made using the apparatus 1. The calibration information 9 may be used to process information obtained from the plurality of sensors 3 of the apparatus 1 to correct for artefacts and defects within the apparatus 1. Each apparatus 1 within an array of apparatus 1 may have unique calibration information 7.

It is to be appreciated that in some examples the apparatus 1 may comprise additional features which are not illustrated in FIG. 1. For instance the apparatus 1 may be configured to be coupled to at least one other apparatus 1 to form an array 21 of sensors. The apparatus 1 may comprise means which enables the apparatus 1 to be coupled to other apparatus 1. In some examples the apparatus 1 may comprise means which enables the apparatus 1 to be coupled to processing circuitry and/or any other suitable circuitry.

FIG. 2 schematically illustrates an array of sensors 21 according to an example of the disclosure. The example array 21 of FIG. 2 comprises a plurality of apparatus 1. Each of the apparatus 1 comprises a plurality of sensors 3 and read out circuitry 5 which may be as described above. Corresponding reference numerals are used for corresponding features.

In the particular example of FIG. 2 the array 21 comprises twelve apparatus 1. It is to be appreciated that any number of apparatus 1 may be provided in other examples of the disclosure.

In the example of FIG. 2 the array 21 comprises a plurality of rectangular apparatus 1 arranged in rectangular array 21. The rectangular array 21 comprises three rows 23 and four columns 25. The rows 23 extend perpendicular to the columns 25. Other arrangements of the apparatus 1 within the array 21 may be used in other examples of the disclosure. For instance, in some examples, the apparatus 1 could be shapes other than rectangles. The shapes of the apparatus 1 could be arranged to minimise the spaces between adjacent apparatus 1. For instance in some examples the array 21 may be arranged over a spherical, or partially spherical, surface. In such examples the apparatus 1 may have pentagon and hexagon shapes so that adjacent apparatus 1 may be tessellated over the spherical surface.

It is also to be appreciated that the array 21 does not need to be rectangular, nor do the apparatus 1 need to be arranged in columns 25 and rows 23. For instance, in some examples the apparatus 1 may be arranged in concentric rings or in any other suitable arrangement.

In the example of FIG. 2 each apparatus 1 is the same size and shape as other apparatus 1 within the array 21. In other examples different apparatus 1 within the array 21 may have different sizes and/or shapes. In some examples the sensor array 21 may comprise at least a first apparatus 1 having a first size and at least a second apparatus 1 having a second size where the first size is different to the second size. In some examples the sensor array 21 may comprise at least a first apparatus 1 having a first shape and at least a second apparatus 1 having a second shape where the first shape is different to the second shape.

In some examples different apparatus 1 within the array 21 may comprises different numbers of sensors 3. For instance the sensor array 21 may comprise at least a first apparatus 1 comprising a first number of sensors 3 and at least a second apparatus 1 having a second number of sensors 3 where the first number of sensors 3 is different to the second number of sensors 3.

In some examples different apparatus 1 within the array 21 may comprise different types of sensors 3. The different sensors 3 could be configured to detect different physical parameters or to have different sensitivities to a physical parameter. For instance one or more apparatus 1 within the array 21 may comprise sensors 3 configured to detect electromagnetic radiation while other apparatus 1 within the array 21 may comprise sensors configured to detect temperature or changes in temperature.

The apparatus 1 may be arranged within the array 21 so as to optimise the sensitivity of the plurality of sensors 3 to the parameters which are to be detected. In some examples the apparatus 1 may be arranged so that there is a larger number of sensors 3 in a first area of the array 21 than in a second area of the array 21. This may give a higher resolution and/or sensitivity in the first area than in the second area. This may provide an efficient sensing device as the array 21 may be arranged so that the higher resolution areas are provided only in the areas where they are needed.

As an example, where the array 21 comprises a plurality of photodetectors arranged to obtain an image, the image capturing system may be arranged so that the object which is to be imaged is positioned in the centre of, or close to the centre of, the image. Most of the information relating to the image of the object will be detected by the sensors 3 in the centre of the array 21 while information relating to the background of the object will be detected by the sensors 3 around the edge of the array 21. In such examples it may be beneficial to have an increased resolution of the photodetectors at the centre of the array 21 than around the edge of the array 21.

This may be achieved by having more apparatus 1 at the centre of the array 21 than at the edges or by having apparatus 1 with more sensors 3 at the centre of the array 21 and apparatus 1 with fewer sensors 3 at the edges of the array 21.

As each apparatus 1 within the array comprises readout circuitry 5 this may enable information to be read from a plurality of apparatus 1 simultaneously. In some examples this may enable an improved sensing array 21 to be provided as the apparatus 1 within the array 21 may be arranged to provide a continuous output. In some examples reading from a plurality of apparatus 1 simultaneously may reduce artefacts from the array 21 as it may reduce or remove the delay in obtaining information from different parts of the array 21. This could be useful when obtaining parameters relating to moving objects such as obtaining images of moving objects.

In some examples calibration information 9 may be stored within the apparatus 1. In other examples the calibration information 9 may be stored externally to the apparatus 1. The sensor array 21 may comprise circuitry and/or may be coupled to circuitry which may be configured to use the identifier information 7 of each apparatus 1 to retrieve the calibration information 9 for each apparatus 1. The circuitry may then use the calibration information 9 to process information obtained from the readout circuitry 5 of the apparatus 1 identified by the identifier information 7.

FIG. 3 schematically illustrates another sensor array 21. The sensor array 21 comprises a plurality of apparatus 1 which may be as described above. Corresponding reference numerals are used for corresponding features.

In the particular example of FIG. 3 the array 21 comprises twenty five apparatus 1. It is to be appreciated that any number of apparatus 1 may be provided in other examples of the disclosure. In the example of FIG. 3 the array 21 comprises a twenty five square apparatus 1 arranged in square array 21. The square array 21 comprises five rows 23 and five columns 25. The rows 23 extend perpendicular to the columns 25. Other configurations of the apparatus 1 within an array 21 may be used in other examples of the disclosure.

FIG. 3 illustrates a plan view of the array 21. In the example of FIG. 3 the plurality of sensors 3 are provided on a front surface of the apparatus 1. This arrangement may be used for sensors 3 such as photodetectors or any other suitable sensors 3. In FIG. 3 only the sensors 3 for one of the apparatus 1 have been illustrated. It is to be appreciated that each of the other apparatus 1 within the array 21 may also comprise a plurality of sensors 3.

In FIG. 3 the sensors 3 within the apparatus 1 are arranged in a plurality of rows 35 of columns 33. It is to be appreciated that other arrangements of the sensors 3 may be used in other examples of the disclosure. Each of the sensors 3 within an apparatus 1 may be addressed by readout circuitry 5 provided within the apparatus 1. The readout circuitry 5 may be configured to read out information from the plurality of sensors 3 in a particular sequence.

In the example of FIG. 3 the plurality of sensors 3 are provided overlaying the readout circuitry 5 and so the readout circuitry 5 is not shown in FIG. 3. In some examples the readout circuitry 5 may be provided on a rear surface of each of the apparatus 1 within the array 21.

FIG. 4 illustrates a perspective view of a portion of the sensor array 21 of FIG. 3 which shows both the readout circuitry 5 and the plurality of sensors 3. Corresponding reference numerals are used for corresponding features.

In the example of FIG. 4 the array 21 is provided on a substrate 41. The substrate has a first side and a second side. Each of the sides of the substrate 41 may provide a surface upon which electronic components may be fabricated and/or positioned.

In some examples substrate 41 may enable a plurality of apparatus 1 to be coupled together to form an array 21. In some examples the substrate 41 may comprise a flexible or curved substrate 41. This may enable the array 21 to be provided in different shapes and configurations.

The apparatus 1 within the array 21 are arranged so that the plurality of sensors 3 are provided on a first side of the substrate 41 and the readout circuitry 5 is provided on the second side. The readout circuitry 5 may be positioned underneath the sensors 3 so that the sensors 3 are overlaying the readout circuitry 5. This may reduce the distance between the sensors 3 and the readout circuitry 5.

Each of the apparatus 1 within the array 21 comprises a plurality of connections 43. The connections 43 extend between the plurality of sensors 3 and the read out circuitry 5. The connections 43 may be provided on both the first side of the substrate 41 and the second side of the substrate 41. The plurality of connections 43 may comprise any electrical connection which may enable electrical output signals to be provided between each of the plurality of sensors 3 within an apparatus 1 and the read out circuitry 5 of the apparatus 1. The plurality of connections 43 may provide a path for direct current between each of the plurality of sensors 3 within an apparatus 1 and the read out circuitry 5 of the apparatus 1. The connections 43 may comprise any electrically conductive material such as copper, silver or any other suitable material.

The readout circuitry 5 may comprise any means which enables an electrical output signal to be read from each of the plurality of sensors 3 within an apparatus 1 and enables an output signal to be provided. The output signal provided by the readout circuitry 5 may comprise the raw data obtained from the plurality of sensors 3.

The readout circuitry 5 may comprise an integrated circuit which may be provided on the opposite side of the substrate 41 to the plurality of sensors 3. In some examples the readout circuitry 5 may comprise an analogue to digital converter (ADC). The ADC may comprise any means which may be configured to convert the analogue signal obtained from the plurality of sensors 3 into a digital output signal. In such examples an ADC may be provided for each of the apparatus 1 within the array 21. It is to be appreciated that other components may be provided within the readout circuitry 5.

Each readout circuitry 5 within the array 21 may be electrically connected to a connector 45. The connector 45 may enable the output signals of the readout circuitry 5 to be provided to processing circuitry. The connector 45 may enable the raw data obtained by the readout circuitry 5 to be provided to processing circuitry. The processing circuitry is not illustrated in the example of FIG. 4. The processing circuitry 4 could be provided connected to the array 21 or positioned remotely from the array 21.

FIGS. 5A to 5C illustrate examples of sensor arrays 21 in which the apparatus 1 within the array 21 have different sizes and/or shapes. In the examples of FIGS. 5A to 5C the arrays 21 comprises a first type of apparatus 1A and a second type of apparatus 1B. The first type of apparatus 1A are smaller than the second type of apparatus 1B. The first type of apparatus 1A may comprise a different type of sensor to the second type of apparatus 1B and/or may comprise a higher resolution of sensors 3. It is to be appreciated that more than two different types of apparatus 1 could be used in other examples of the disclosure.

In the example of FIG. 5A four first types of apparatus 1A are provided in the centre of the array 21 and eight second type of apparatus 1B are provided around the edges of the array 21. As the first type of apparatus 1A may comprise a different type of sensor to the second type of apparatus 1B and/or may comprise a higher resolution of sensors 3 this may make the sensor array 21 more sensitive at the centre of the array 21 than at the edges. This may improve the efficiency of the sensor array 21 as it may enable the sensor array 21 to be configured so that more information is obtained from the apparatus 1 in the centre of the array 21 than the apparatus 1 positioned at the edges. This could be useful in examples such as photodetectors where the array 21 is arranged to obtain image information. In such examples the imaging system may be arranged so that the image is focused on the centre of the array 21 where the first type of apparatus 1A provide a higher resolution.

In the example of FIG. 5B one second type of apparatus 1B is provided offset from the centre of the array 21 and twenty one first type of apparatus 1A are provided around the edges of the array 21. As in FIG. 5A the first type of apparatus 1A are smaller than the second type of apparatus 1B and may comprise a different type of sensor to the second type of apparatus 1B and/or may comprise a higher resolution of sensors 3. In the example of FIG. 5B this may make the sensor array 21 more sensitive at the edges of the array 21 than at the location of the second type of apparatus 1B.

In the example of FIG. 5C the respective apparatus 1A, 1B are arranged in an irregular shape rather than in a regular polygon such as the rectangles of FIGS. 5A and 5B.

In the example of FIG. 5C one second type of apparatus 1B is provided surrounded by fourteen first type of apparatus 1A provided around the edges of the array 21. Two of the first type of apparatus 1A extend out of one of the edges of the array 21 to provide an irregular shaped array. It is to be appreciated that the sizes and shapes of the apparatus 1A within the array may be arranged into any formation so that the array 21 may have any size or shape as needed.

FIG. 6 illustrates a method. The method may be used to form an array 21 of sensors 3 comprising a plurality of apparatus 1 as described above.

The method comprises, at block 61, providing an apparatus 1 comprising a plurality of sensors 3. The apparatus 1 comprises readout circuitry 5 configured to read information from each of the plurality of sensors 3. The apparatus 1 has identifier information 7 assigned to the apparatus 1. At block 63 the method comprises calibrating the apparatus 1 to obtain calibration information 9 and at block 65 the method comprises storing the calibration information 9 with the identifier information 7. At block 67 the apparatus 1 is coupled to at least one other apparatus 1 to form an array 21 of sensors 3.

In some examples the block 63 of calibrating may comprise performing calibration measurements on a single apparatus 1. The individual apparatus 1 may be calibrated when it is manufactured and before it is coupled to other apparatus 1 to form an array 21. This may enable calibration information 9 specific to the apparatus 1 to be obtained. The calibration information 9 may then be stored with the identifier information 7 so that the calibration information 9 may be retrieved when the apparatus 1 is used.

In some examples the method may comprise an additional calibration measurement. The additional calibration measurement may comprise calibrating the sensor array 21 after the plurality of apparatus 1 have been coupled together. The second calibration may allow for correction of artefacts within the system. For instance it may correct for lens artefacts in imaging devices or any other effects which may affect the sensor array 21.

In some examples the additional calibration measurement may enable the locations of apparatus 1 within the sensor array 21 to be determined. In some examples information indicative of the location of the apparatus within the array 21 may be stored with the identifier information 7 and/or the calibration information 9.

FIG. 7 illustrates a method which may be used to read information from an array 21 of sensors 3. In the example of FIG. 7 the array 21 comprises a plurality of apparatus 1 which may be as described above. The apparatus 1 are arranged in a rectangular array 21. In the example of FIG. 7 only nine apparatus 1 within the array 21 are illustrated, however the ellipses 71 indicate that the array 21 comprises apparatus 1 which are not illustrated in FIG. 7.

Any number of apparatus 1 may be used in examples of the disclosure. The number of apparatus 1 which are used may depend on factors such as the parameter or parameters which are being detected, the sensitivity and/or resolution required and any other suitable factor.

In the example of FIG. 7 the plurality of sensors 3 comprise photodetectors which are configured to enable an image to be obtained. It is to be appreciated that in other examples other types of sensor 3 may be used.

Each of the apparatus 1 within the array 21 comprises identifier information 7. In the example of FIG. 7 the identifier information 7 comprises a sequence of digits. The sequence of digits enable each apparatus 1 within the array 21 to be identified so each apparatus 1 has a different string of digits to the other apparatus 1 within the array 21. It is not necessary for the identifier information 7 to be used to differentiate between apparatus 1 comprised within different arrays 21.

At block 72 the array 21 of sensors 3 captures image information. The image information is read from each of the apparatus 1 within the array 21 by the readout circuitry 5 of each apparatus 1. As each apparatus 1 has individual readout circuitry 5 this may enable the raw data to be obtained from the plurality of apparatus 1 simultaneously.

At block 74 the information obtained from each of the apparatus 1 is provided to processing circuitry 73. A connector 45, such as the connector of FIG. 4 may be used to enable the information to be provided form the readout circuitry 5 to the processing circuitry 73.

The processing circuitry 73 may comprise one or more processors. The processing circuitry 73 may also comprise an output interface via which data and/or commands are output by the processing circuitry 73 and an input interface via which data and/or commands are input to the processing circuitry 73. The processing circuitry 73 may be configured to read from and write to memory circuitry 11.

Although the processing circuitry 73 is illustrated as a single component in the figures it is to be appreciated that it may be implemented as one or more separate components some or all of which may be integrated/removable.

The information that is provided to the processing circuitry 73 may comprise the raw data that is obtained from the sensors 3 and the identifier information 7 associated with the apparatus 1 from which the raw data was obtained. The identifier information 7 may be associated with the raw data so that the processing circuitry 73 can identify the apparatus 1 from which the raw data was obtained.

At block 76 the processing circuitry 73 applies calibration information 9 to each of the sets of raw data that is obtained from the array 21. The processing circuitry 73 may be configured to use the identifier information 7 to retrieve the calibration information 9 associated with each apparatus 1. The calibration information 9 is then used to process the raw data obtained from each apparatus 1 and correct for any artefacts within the individual apparatus 1.

At block 78 the information from the apparatus 1 is remapped to the location corresponding to the location of the apparatus 1 within the array 21. The remapping may comprise using the identifier information 7 to determine the location of the apparatus 1 within the array 21. As the readout circuitry 5 may be configured to enable the information to be read from each of the apparatus 1 simultaneously, the raw data from each of the apparatus 1 may be provided to the processing circuitry 73 in any order. There is no requirement for the apparatus 1 to provide the raw data to the processing circuitry 73 in a particular sequence. The processing circuitry 73 may use the identifier information 7 provided with each set of raw data to identify the apparatus 1 and the location of the apparatus 1 within the array 21.

The location of each apparatus 1 within an array 21 may be determined using any suitable methods. For example, after the array 21 has been formed the array 21 may be used to capture a known image. The data obtained from the array 21 may then be used to determine the location of each apparatus 1 within the array 21. The location information may be stored in memory circuitry with the identifier information 7 and/or the calibration information 9.

This location information for each apparatus 1 may be used to map the obtained raw data to a position within the array 21. At block 80 the mapped information is processed to obtain an image which is then provided as the output 82 of the processing circuitry 73.

In the example of FIG. 7 the processing circuitry 73 is illustrated as separate to the array 21. In such examples the processing circuitry 73 could be coupled to the array 21 by a wired or wireless communication link. In other examples the processing circuitry could be provided within the array 21.

Examples of the disclosure provide an improved apparatus 1 and method for sensing.

In examples of the disclosure a sensor array 21 may be comprised from a plurality of individual sensor apparatus 1. This modular arrangement provides a large degree of freedom in the design and configuration of the array 21. It may enable different sensors and types of apparatus 1 to be coupled together in different ways.

The modular construction of the array 21 may enable the array 21 to be formed in any desired size and shape. For instance it may enable curved and/or three dimensional arrays to be formed. Each apparatus 1 within the array 21 may be made in any desired shape so as to enable the apparatus 1 to be coupled together to form the array 21.

In some examples the sensor arrays 21 may be configured to provide significant power savings. For example, by having higher resolution of sensor in some areas of the array 21 than in others this could enable the power and processing requirements of the array 21 to be focused on the areas of the array 21 that are likely to obtain the most useful information. In some examples different apparatus within a sensor array 21 may have different sample rates, different sample depths and/or any other different configurations which may reduce the power consumption of the apparatus 1.

In some examples an apparatus 1 within a sensor array 21 may only be active when it is powered on. In some examples the array 21 could be arranged so that only some of the apparatus 1 within the array 21 are active at a given time. This may enable significant power saving of the array 21. The apparatus 1 which are powered on and off may be controlled by processing circuitry 73. The processing circuitry 73 may be configured to use raw data obtained from sensors 3 to determine which apparatus 1 should be powered on and which apparatus 1 should be powered off.

In some examples the array 21 could be arranged so that an active apparatus is configured to detect a trigger event. Before the trigger event is detected one or more other apparatus 1 in the sensor array 21 may be powered off. In some examples one active apparatus 1 may be used and all other apparatus 1 within the sensor array 21 may be powered off. In response to detecting the triggering event the processing circuitry 73 may be configured to activate one or more apparatus 1 within the array 21 that had previously been powered off. This may reduce the power requirements of the sensor array 21.

The triggering event may comprise any event which may be detected by the active apparatus 1. In some examples the triggering event may comprise a detected parameter exceeding a threshold, a combination of parameters being detected, a parameter being detected within a given time frame or any other suitable event or combination of events. In some examples the triggering event may be the beginning of the exposure of the sensor array 21 to the parameter which is to be detected. For instance if X-rays or other radiation is being used to enable an image to be captured then a first apparatus 1 may be used to detect that the start of the exposure of the sensor array 21 to the X-rays or other radiation. In such examples the first apparatus 1 may be configured to have a fast response to the incident X-rays or other radiation to enable synchronisation between the source of the X-rays or other radiation and the sensor array 21. In such examples only one apparatus 1 needs to be configured to detect the trigger event. In other examples more than one apparatus 1 may be used to detect a triggering event.

In some examples power saving and/or improved processing requirements may be obtained by using different binning modes for different apparatus 1. By binning, or combining information from adjacent sensors 3 within an apparatus 1 the resolution of an apparatus 1 may be reduced but the power requirements and processing requirements may be improved. As each apparatus 1 may be addressed individually each apparatus 1 within an array 21 may be configured to use different binning modes. The binning mode which is used by each apparatus 1 may be controlled by processing circuitry 73. The processing circuitry 73 may be configured to use raw data obtained from sensors 3 to determine which binning mode each apparatus 1 should be using.

As each of the apparatus 1 within the array 21 comprises readout circuitry 5 this may enable the raw data to be read from each of the apparatus 1 in any order. This may enable the information to be obtained from one or more apparatus 1 simultaneously. It also removes the requirement for the sensors to be read in predefined sequences as would be the case with a columnar array of pixels for example.

In this description and claims the term coupled means operationally coupled. Any number or combination of intervening elements can be provided between coupled components including no intervening elements.

As used in this application, the term "circuitry" refers to all of the following:
(a) hardware-only circuit implementations (such as implementations in only analog and/or digital circuitry) and
(b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and
(c) to circuits, such as a microprocessor(s) or a portion of a microprocessor(s), that require software or firmware for operation, even if the software or firmware is not physically present.

This definition of "circuitry" applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the applicant claims protection in respect of any patentable feature or combination of features hereinbefore referred to and/or shown in the drawings whether or not particular emphasis has been placed thereon.

We claim:

1. A sensor array comprising a plurality of apparatuses, wherein each apparatus in the plurality of apparatuses comprises:
   a plurality of sensors; and
   readout circuitry configured to read information from each of the plurality of sensors,
   wherein each apparatus has identifier information and calibration information stored with the identifier information and each apparatus is configured to be coupled to at least one other apparatus in the sensor array, and
   wherein each apparatus is configured to be calibrated before each apparatus is coupled to at least one other apparatus in the sensor array and the sensor array is configured to be calibrated after the plurality of sensors has been coupled together.

2. The sensor array according to claim 1, wherein the identifier information enables each apparatus to be uniquely identified within the sensor array.

3. The sensor array according to claim 1, wherein the identifier information enables a location of each apparatus within the sensor array to be determined.

4. The sensor array according to claim 1, wherein each apparatus comprises a circuitry configured to use the identifier information to retrieve the calibration information and use the calibration information to process information obtained from the readout circuitry of the apparatus identified by the identifier information.

5. The sensor array according to claim 1, wherein the plurality of sensors is provided on a front side of a substrate.

6. The sensor array according to claim 1, wherein the plurality of sensors are is provided overlying at least part of the readout circuitry.

7. The sensor array according to claim 1, wherein at least part of the readout circuitry is provided on a rear side of a substrate.

8. The sensor array according to claim 1, wherein the plurality of sensors comprises at least one of:
   electromagnetic radiation sensors, temperature sensors, chemical sensors, humidity sensors, strain sensors, and pressure sensors.

9. The sensor array according to claim 1, wherein the readout circuitry is configured to enable information to be read from a plurality of apparatuses simultaneously.

10. The sensor array according to claim 1, wherein the sensor array comprises at least a first apparatus having a first size and at least a second apparatus having a second size, wherein the first size is different from the second size.

11. The sensor array according to claim 1, wherein the sensor array comprises at least a first apparatus having a first shape and at least a second apparatus having a second shape, wherein the first shape is different from the second shape.

12. The sensor array according to claim 1, wherein the sensor array comprises at least a first apparatus comprising a first number of sensors and at least a second apparatus having a second number of sensors, wherein the first number of sensors is different to from the second number of sensors.

13. The sensor array according to claim 1, wherein the sensor array comprises an active apparatus configured to detect a trigger event and control circuitry configured to activate a plurality of apparatus within the sensor array in response to the detected trigger event.

14. A method comprising:
   providing a plurality of apparatuses comprising a plurality of sensors wherein each apparatus comprises readout circuitry configured to read information from each of the plurality of sensors and has identifier information assigned to the apparatus;
   calibrating each apparatus to obtain calibration information;
   storing the calibration information with the identifier information;
   coupling the apparatus to at least one other apparatus to form a sensor array; and
   calibrating the sensor array after the plurality of apparatuses has been coupled together.

15. The method according to claim 14, wherein having the identifier information enables each apparatus to be uniquely identified within the sensor array.

16. The method according to claim 14, wherein having the identifier information enables a location of each apparatus within the sensor array to be determined.

17. The method according to claim 14, wherein comprising the circuitry enables to use the identifier information to retrieve the calibration information and use the calibration information to process information obtained from the readout circuitry of the apparatus identified by the identifier information.

18. The method according to claim 14, wherein the plurality of sensors are is provided on a front side of a substrate.

19. A non-transitory computer readable medium comprising program instructions stored thereon for performing at least the following:
- causing an apparatus comprising a readout circuitry to perform a read information from each of a plurality of sensors of the apparatus and comprising identifier information assigned to the apparatus;
- calibrating the apparatus to obtain calibration information;
- storing the calibration information with the identifier information;
- coupling the apparatus to at least one other apparatus to form a sensor array; and
- calibrating the sensor array after the apparatuses have been coupled together.

* * * * *

UNITED STATES PATENT AND TRADEMARK OFFICE
CERTIFICATE OF CORRECTION

PATENT NO. : 10,794,739 B2
APPLICATION NO. : 15/770630
DATED : October 6, 2020
INVENTOR(S) : Helena Pohjonen, Sami Kallioinen and Pekka Korpinen Page 1 of 1

It is certified that error appears in the above-identified patent and that said Letters Patent is hereby corrected as shown below:

In the Claims

In Claim 6:
Column 14, Line 8, "are" should be deleted.

In Claim 18:
Column 14, Line 66, "are" should be deleted.

Signed and Sealed this
Tenth Day of November, 2020

Andrei Iancu
*Director of the United States Patent and Trademark Office*